United States Patent
Yamaguchi et al.

(10) Patent No.: US 9,256,141 B2
(45) Date of Patent: Feb. 9, 2016

(54) EXPOSURE APPARATUS, DEVICE MANUFACTURING METHOD USING SAME, AND GAS SUPPLY DEVICE

(75) Inventors: Naoki Yamaguchi, Utsunomiya (JP); Yuuhei Matsumura, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 987 days.

(21) Appl. No.: 13/092,657

(22) Filed: Apr. 22, 2011

(65) Prior Publication Data
US 2011/0261333 A1    Oct. 27, 2011

(30) Foreign Application Priority Data
Apr. 23, 2010    (JP) .................. 2010-099996

(51) Int. Cl.
| | |
|---|---|
| *B01L 1/04* | (2006.01) |
| *B60R 1/06* | (2006.01) |
| *G02B 7/18* | (2006.01) |
| *G03B 27/32* | (2006.01) |
| *G03F 7/20* | (2006.01) |
| *F24F 3/14* | (2006.01) |
| *F24F 3/16* | (2006.01) |

(52) U.S. Cl.
CPC ............. *G03F 7/70883* (2013.01); *F24F 3/14* (2013.01); *G03F 7/70858* (2013.01); *G03F 7/70908* (2013.01); *G03F 7/70933* (2013.01); *F24F 3/161* (2013.01)

(58) Field of Classification Search
CPC ........... F24F 3/14; F24F 3/161; F24F 11/047; G03F 7/708; G03F 7/70858; G03F 7/70883; G03F 7/70908; G03F 7/70933
USPC ......... 261/127, 129; 355/30, 53, 77; 359/507, 359/509, 512; 430/325; 454/187
See application file for complete search history.

(56) References Cited

U.S. PATENT DOCUMENTS

2009/0231559 A1* 9/2009 Holmes ........................... 355/30

FOREIGN PATENT DOCUMENTS

JP    9275054 A    10/1997

* cited by examiner

*Primary Examiner* — Colin Kreutzer
(74) *Attorney, Agent, or Firm* — Rossi, Kimms & McDowell LLP

(57) ABSTRACT

The exposure apparatus includes a purge member that includes a humidifier that humidifies supplied gas; a first regulator that regulates a flow rate of first gas which passes through the humidifier; a second regulator that regulates a flow rate of second gas which does not pass through the humidifier; a variable instrument that varies a humidifying performance of the humidifier; a sensor; and a controller. Here, the controller controls the first and the second regulators to adjust a flow rate ratio of the first gas and the second gas on the basis of the humidity of the humidified gas detected by the sensor and a pre-set target humidity, and controls the variable instrument to keep the flow rate of the first gas constant on the basis of an amount of operation of the first regulator and an amount of pre-set target operation.

20 Claims, 7 Drawing Sheets

EXPOSURE APPARATUS, DEVICE MANUFACTURING METHOD USING SAME, AND GAS SUPPLY DEVICE

BACKGROUND OF THE INVENTION

1. Field of the Invention

The present invention relates to an exposure apparatus, a device manufacturing method using the same, and a gas supply device.

2. Description of the Related Art

An exposure apparatus is an apparatus that transfers a pattern of an original (reticle or mask) onto a photosensitive substrate (e.g., wafer, glass plate, or the like, where the surface thereof is coated with a resist layer) via a projection optical system in a lithography process of a manufacturing process for a semiconductor device, a liquid crystal display device, or the like. The exposure apparatus generally includes a chamber that surrounds the entire exposure apparatus. The chamber circulates air to keep it clean while keeping the ambient temperature of the exposure apparatus body constant. The chamber mainly includes an air conditioning machine room that performs air temperature control, a dust collecting filter that filters micro foreign matter to thereby form a uniform flow of clean air, and a booth that isolates the apparatus environment from the outside. In this case, temperature-controlled air is supplied into the booth via the dust collecting filter and the like using an air blower provided inside the air conditioning machine room. The supplied air is again taken into the air conditioning machine room from the return port disposed at the booth to thereby circulate in the chamber. In order to prevent micro foreign matter or harmful gas from entering into the interior of the exposure apparatus through minute clearances of the booth, the chamber is controlled such that outside air, which corresponds to approximately 0.1 of the amount of circulation air, is introduced from an outside-air introduction port provided in the air conditioning machine room to thereby constantly maintain the air pressure in the booth at a positive pressure. However, when the exposure apparatus is operated over a long period of time, the circulation air in the booth comes into contact with the final optical members that configure an illumination optical system, and the projection lenses that respectively configures the top surface and the bottom surface of the projection optical system to thereby make the surfaces of these optical elements cloudy. Consequently, the productivity of the exposure apparatus undesirably decreases due to illumination deterioration of exposure light. Therefore, in a conventional exposure apparatus, the final optical members of the illumination optical system and the projection lenses of the projection optical system are purged by clean inert gas such as nitrogen gas or the like, whereby the occurrence of fogging on these optical elements is suppressed to low level.

In addition, the air in the clean room where the exposure apparatus is installed generally includes minute quantities of chemical pollutants such as basic gas (ammonia, amine, and the like), acidic gas (sulfuric acid, nitric acid, hydrogen chloride, and the like), and organic gas (siloxane, and the like). These gases are also discharged in minute quantities from the components of the exposure apparatus. Hence, a conventional chamber includes a chemical filter in order to reduce the concentration of the chemicals contained in the air within the booth below a ppb level. The chemical filter is a filter that removes basic gas and acidic gas using an ion exchange reaction or removes organic gas using an activated carbon. For example, the chemical filter having the side of 600 mm and the thickness of 60 mm is employed in a stacked configuration in accordance with the installation environment and the required reduction in the concentration. However, when the amount of circulation of air within the booth increases accompanying the increasing size of exposure apparatuses, a chemical filter with a larger opening, which reduces the face velocity in the plane of the chemical filter, needs to be selected in order to improve the adsorption efficiency. Furthermore, when the amount of air to be taken from the outside of the booth increases, the amount of basic gas, acidic gas, and organic gas to be taken from inside the clean room also increases, resulting in a reduction in lifetime of the chemical filter. Specifically, in order to extend the replacement cycle and reduce the down time of the exposure apparatus, more chemical filters need to be provided, resulting in the increased size of the exposure apparatus.

In contrast, in order to suppress fogging on the optical elements while avoiding increasing the size of the exposure apparatus, there is a method for locally purging each of the optical element portions in contact with air within the booth with humidified air. The flow rate of humidified air is a low flow rate from one per thousands to one per tens of thousands compared to that of circulation air. The method is an energy-saving system compared with the method for removing pollutants from all circulation air to thereby lower the concentration to a required level. As a method using humidified air, Japanese Patent Laid-Open No. 9-275054 discloses a semiconductor exposure apparatus that controls the humidification of clean dry air (hereinafter referred to as "CDA") supplied from the production facility to thereby supply the clean dry air via a chemical filter into the apparatus. Examples of the humidifying method to be used in the semiconductor exposure apparatus include a method for adjusting the temperature of a humidifier using a humidity sensor, and a method for controlling the flow rate of CDA to be sent to the humidifier. The semiconductor exposure apparatus ejects humidified air onto the surfaces of the optical elements and lowers the concentration of chemical pollutants contained in the atmosphere near the surfaces thereof for fogging prevention. The aforementioned humidified air is a generic name for gas having a dew-point temperature of 0 degrees Celsius or above, in which most of impurities are removed to the same level as CDA, whereas CDA is very dried air having a dew-point temperature of about −60 degrees Celsius.

However, the semiconductor exposure apparatus disclosed in Japanese Patent Laid-Open No. 9-275054 adjusts the amount of humidification of CDA by changing the temperature of an object or liquid. In this case, the thermal time constant of an object or liquid is relatively high, and consequently a highly-accurate humidity control cannot be performed. On the other hand, unlike the method using heat, in the method for controlling the flow rate of CDA to be sent to the humidifier, the effect of the thermal time constant of an object or liquid is reduced, whereby a highly-accurate humidity control can be performed. However, it is essential that the performance of a humidifying medium be in a predetermined range, and thus, a change in the performance of a humidifying medium cannot be ignored. Here, the performance of a humidifying medium includes, for example, a saturated steam pressure that varies depending on the temperature of CDA. Furthermore, in a vaporizing humidification method, the heat is removed from the surroundings by means of heat of vaporization when liquid is vaporized. Consequently, the temperature of liquid is reduced, and thus the saturated steam pressure is also reduced, resulting in a reduction in the absolute humidity of gas passed through the humidifier. Furthermore, from the viewpoint of the fluctuation of a laser interferometer, it is desirable that humidity be controlled following the humidity inside the space. However, liquid to be supplied to the humidifier may be directly supplied from the place where the humidifier is installed, so that the temperature of liquid may not always be controlled. The same also applies because the temperature fluctuation under the environment where the humidifier is placed also depends on the place where the humidifier is installed.

SUMMARY OF THE INVENTION

In view of the foregoing, the present invention provides an exposure apparatus that suppresses the generation of dew condensation due to excessive humidifying performance of the humidifier and also suppresses control defects due to an insufficiency in the humidifying performance thereof, when a method for locally purging the surfaces of the optical elements with humidified air (humidified gas) is employed.

According to an aspect of the present invention, an exposure apparatus is provided that includes a purge member that purges a surface of an optical element with humidified gas, wherein the purge member includes a humidifier that humidifies supplied gas; a first regulator that regulates a flow rate of first gas which passes through the humidifier; a second regulator that regulates a flow rate of second gas which does not pass through the humidifier; a variable instrument that varies a humidifying performance of the humidifier; a sensor that detects a humidity of the humidified gas; and a controller that controls the first regulator, the second regulator, and the variable instrument, and wherein the controller controls the first and the second regulators to adjust a flow rate ratio of the first gas and the second gas on the basis of the humidity of the humidified gas detected by the sensor and a pre-set target humidity, and controls the variable instrument to keep the flow rate of the first gas constant on the basis of an amount of operation of the first regulator and an amount of pre-set target operation.

According to the present invention, an exposure apparatus that suppresses the generation of dew condensation due to excessive humidifying performance of the humidifier and also suppresses control defects due to an insufficiency in the humidifying performance thereof, when a method for locally purging the surfaces of the optical elements with humidified air is employed, may be provided.

Further features of the present invention will become apparent from the following description of exemplary embodiments with reference to the attached drawings.

DESCRIPTION OF THE EMBODIMENTS

Hereinafter, preferred embodiments of the present invention will now be described with reference to the accompanying drawings.

(First Embodiment)

Figure 1:
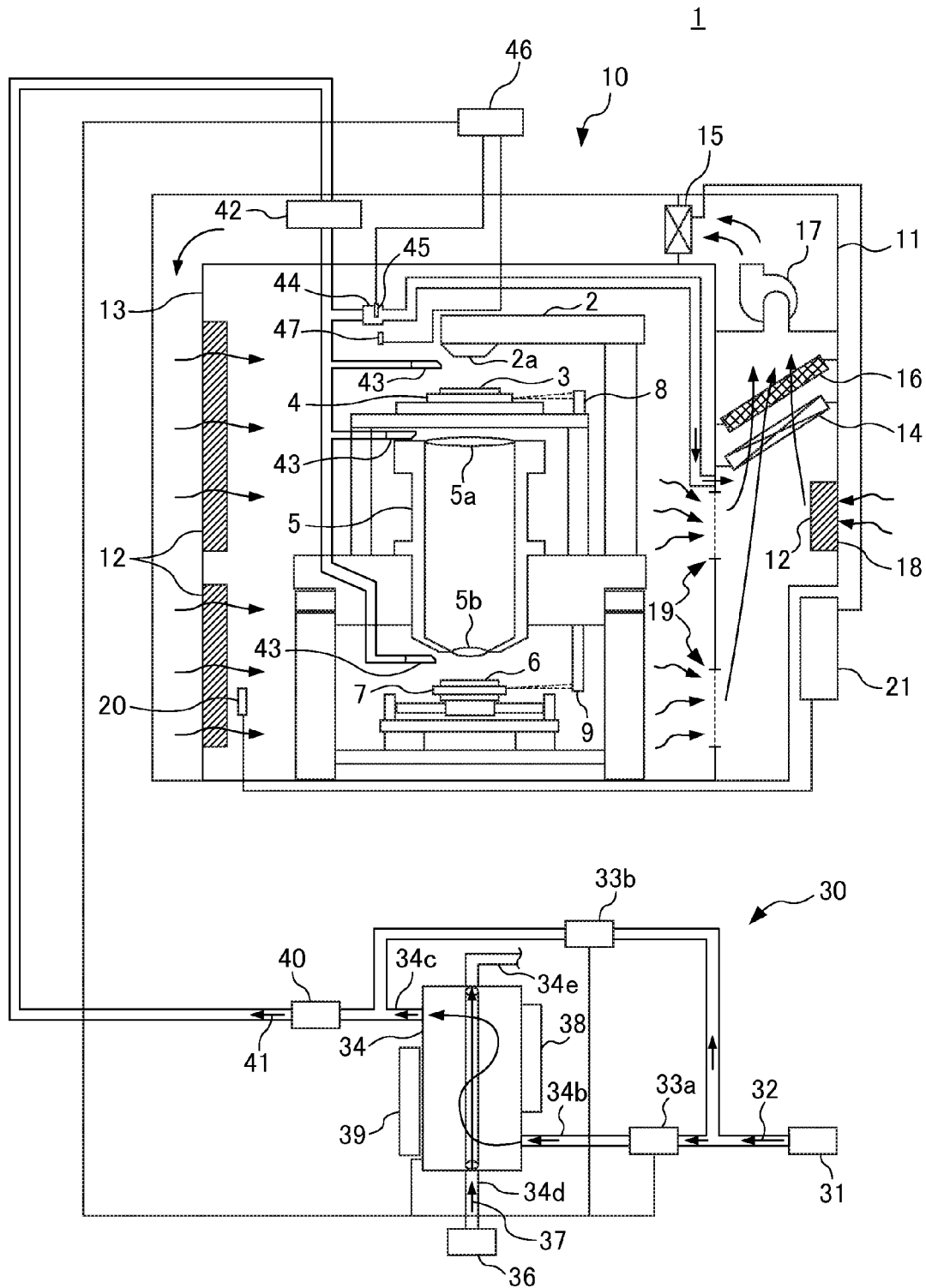
FIG. 1 is a schematic diagram illustrating the configuration of an exposure apparatus according to a first embodiment of the present invention.

First, the configuration of the exposure apparatus of the present invention will now be described. FIG. 1 is a schematic diagram illustrating the configuration of an exposure apparatus according to an embodiment of the present invention. The exposure apparatus of the present embodiment is an apparatus that performs exposure processing on a wafer, i.e., a substrate to be treated, which is employed in the semiconductor device manufacturing processes. The exposure apparatus of the present embodiment is a scanning projection exposure apparatus employing a step-and-repeat system or a step-and-scan system. First, an exposure apparatus 1 includes an illumination optical system 2, a reticle stage 4 that holds a reticle 3, a projection optical system 5, a wafer stage 7 that holds a wafer 6, and a control section (not shown) that controls the components provided in the exposure apparatus 1.

The illumination optical system 2 includes a light source section (not shown), and is a device that illuminates the reticle 3 on which a transfer circuit pattern is formed. At the light source section, the light source uses a laser, for example. Available lasers include an ArF excimer laser with a wavelength of about 193 nm, a KrF excimer laser with a wavelength of about 248 nm, an F2 excimer laser with a wavelength of about 157 nm, and the like. The type of laser is not limited to an excimer laser, and for example, a YAG laser may also be used. The number of lasers is also not limited. In addition, when the light source section utilizes a laser, a light beam shaping optical system that shapes a parallel light flux from the laser light source into a desired beam shape or an incoherent optical system that makes a coherent laser incoherent is preferably used. Furthermore, a light source available for the light source section is not limited to a laser, but a single or a plurality of lamps such as a mercury lamp or a xenon lamp may also be used.

Also, the illumination optical system 2 includes a lens, a mirror, a light integrator, a diaphragm, and the like, none of which are shown. In general, the internal optical system is aligned in the order of a condenser lens, a fly-eye lens, an aperture diaphragm, a condenser lens, a slit, and an imaging optical system. In this case, the light integrator includes an integrator constructed by overlying fly-eye lenses or two pairs of cylindrical lens array sheets. Note that the light integrator may be replaced with an optical rod or a diffractive element. Also, an aperture diaphragm is arranged as a circular diaphragm, an annular illumination diaphragm for deformed illumination, a quadrupole illumination diaphragm, or the like.

The reticle 3 is, for example, an original plate made of quartz glass. The pattern to be transferred is formed on the reticle 3. Also, the reticle stage 4 is an original stage that is moveable in the horizontal direction, and is a device that holds and positions the reticle 3. When scanning exposure is performed, the reticle stage 4 is scan-driven in the horizontal direction. Furthermore, the reticle stage 4 includes a moving mirror (not shown) on the side thereof. A laser interferometer 8 that detects the position of the reticle stage 4 by projecting a laser beam onto the moving mirror and receiving reflected light therefrom is provided on the outer periphery of the reticle stage 4.

The projection optical system 5 projects and exposes the pattern on the reticle 3, which has been illuminated with exposure light from the illumination optical system 2, onto the wafer 6 with a predetermined magnification (e.g., 1/4 or 1/5). As the projection optical system 5, an optical system consisting only of a plurality of optical elements or an optical system (catadioptric optical system) consisting of a plurality of optical elements and at least one concave mirror can be employed. Alternatively, as the projection optical system 5, an optical system consisting of a plurality of optical elements and at least one diffractive optical element such as a kinoform, an entire mirror type optical system, or the like can also be employed.

The wafer 6 is a substrate made of a single crystal silicon. A resist (photoresist) is applied to the surface thereof. Also, the wafer stage 7 is a substrate stage that is moveable in the three dimensions, and is a device that holds and positions the wafer 6. When scanning exposure is performed, the wafer stage 7 is scan-driven in the horizontal direction as in the reticle stage 4. Note that in the case of normal scanning exposure, the reticle stage 4 and the wafer stage 7 are scan-driven in the directions opposite to each other. On the other hand, in the case of still exposure, the reticle stage 4 and the wafer stage 7 are not driven during exposure. Furthermore, the wafer stage 7 includes a moving mirror (not shown) on the side thereof. A laser interferometer 9, which detects the position of the wafer stage 7 and vibration thereof by projecting a laser beam onto the moving mirror and receiving reflected light therefrom, is provided on the outer periphery of the wafer stage 7.

The control section is a control unit configured to control the components such as an optical system, a stage system, and the like in order to carry out exposure processing, driving of the reticle 3 and the wafer 6 upon exposure processing, and the like. The control section carries out each process in the form of a sequence or a program, and is configured by a calculator including a storage device configured by a magnetic storage device, a memory, or the like, a sequencer, and the like.

The exposure apparatus 1 also includes a chamber 10 that surrounds the entire exposure apparatus 1. The chamber 10 circulates air to keep it clean while keeping the ambient temperature of the body of the exposure apparatus 1 constant. The chamber 10 includes an air conditioning machine room 11 that performs air temperature control, a dust collecting filter 12 that filters micro foreign matter to thereby form a uniform flow of clean air, and a booth 13 that intercepts the apparatus environment from the outside. The air conditioning machine room 11 further includes a cooler 14, a reheating heater 15, a chemical filter 16, and an air blower 17. First, the air conditioning machine room 11 introduces outside air into an internal space via an outside-air introduction port 18 that is positioned at the dust collecting filter 12 provided inside the air conditioning machine room 11. Next, the air conditioning machine room 11 controls the temperature of the introduced air using the cooler 14 and the reheating heater 15, and cleans the introduced air via the dust collecting filters 12 and the chemical filters 16 provided at a plurality of locations to thereby supply the cleaned air in the booth 13 using the air blower 17. Note that the air conditioning machine room 11 re-captures the air temporarily supplied into the booth 13 into the internal space from the return port 19 to thereby allow the air to circulate in the chamber 10. Furthermore, the air conditioning machine room 11 includes a temperature measuring device 20 that measures the temperature of air which has passed through the dust collecting filter 12 and has been introduced into the booth 13, and a temperature control section 21 that controls the temperature to be measured by the temperature measuring device 20 so as to be stabilized by operating the reheating heater 15.

As a local purge device, the exposure apparatus 1 further has a humidified air supply device (purge member: gas supply device) 30 that supplies humidified air (humidified gas) to the respective locations in the chamber 10. First, the humidified air supply device 30 includes a CDA supply source 31, a fluid control device (first regulator) 33a, a fluid control device (second regulator) 33b, and a vaporizing humidifier 34. The humidified air supply device 30 further includes a heater 38 and an object temperature detecting section 39 that are humidifying performance variable instruments (variable instruments) configured to vary the humidifying performance of the vaporizing humidifier 34, a gas mixer 40, a heat exchanger 42, an air nozzle 43, and a humidity detecting section 45. Furthermore, the humidified air supply device 30 includes a control calculation section (controller) 46 that controls the fluid control device 33a, the fluid control device 33b, and the humidifying performance variable instrument. Specifically, in the present embodiment, with the aid of the components described above, the humidified air supply device 30 constitutes a humidity adjustment unit configured to be capable of adjusting the humidity of humidified air with respect to the humidity detecting section 45 serving as a humidity measurement unit configured to measure the humidity of humidified air.

The CDA supply source 31 is a gas supply source that introduces dried clean air from the factory facility in which the exposure apparatus 1 is installed. It is desirable that gas for use in local purges has substantially the same composition as that of gas which circulates in the booth 13. For example, when the booth 13 is filled with air, the CDA 32 is preferred as in the present embodiment. On the other hand, when the booth 13 is filled with inert gas such as nitrogen or the like, a supply source that supplies that kind of atmosphere gas is preferably used.

Each of the fluid control device 33a and the fluid control device 33b is a fluid control unit employing a mass flow controller that is capable of controlling the flow rate of the CDA 32 and responding at high speed. Among them, the fluid control device 33a is positioned at an upstream side of a vaporizing humidifier 34 to be described below, whereas the fluid control device 33b is connected to the downstream side of the vaporizing humidifier 34. The CDA 32 supplied from the CDA supply source 31 is split into two gases (first gas (CDA), and second gas (CDA)). The first air and the second air are introduced into the fluid control device 33a and the fluid control device 33b, respectively. Then, the fluid control device 33a and the fluid control device 33b controls the flow rate via push-pull such that the total flow rate of the CDA 32 is always kept constant. Note that each fluid control device may not be a single mass flow controller, but may be configured by a plurality of devices including a mass flow meter having a fluid measurement function, a fluid control valve having a fluid control function, and the like.

The vaporizing humidifier 34 (hereinafter abbreviated as "humidifier 34") is a humidifying unit configured to be capable of humidifying gas, which passes through the periphery of the object, using the natural vaporization of liquid by soaking liquid into a filter-like object. In the present embodiment, the vaporizing humidifier 34 is intended to humidify the CDA 32 which has been introduced through the fluid control device 33a. Note that the humidifying performance of a typical vaporizing humidifier may change due to the temperature or the flow rate of gas serving as a medium, the temperature or the flow rate of liquid to be vaporized, the temperature of the humidifier itself, and the like. Accordingly, in the present embodiment, a humidifier using a gas-permeable filter is employed. Here, gas permeability means the property of allowing gas but not liquid to pass through, and the gas-permeable filter is composed of, for example, a member with a fluorine resin thinly bundled, a hollow fiber of a polyolefin polymer, or the like. The humidifier 34 has a pipe 35 that extends therethrough. The pipe 35 introduces the liquid 37 supplied from a liquid supply source 36 into the lower pipe 34d to be described below and discharges water into a drainage line (not shown). Also, the humidifier 34 includes the heater (heater for object) 38 and the object temperature detecting section 39 that perform the temperature control of the shell of the humidifier 34.

Figure 2:
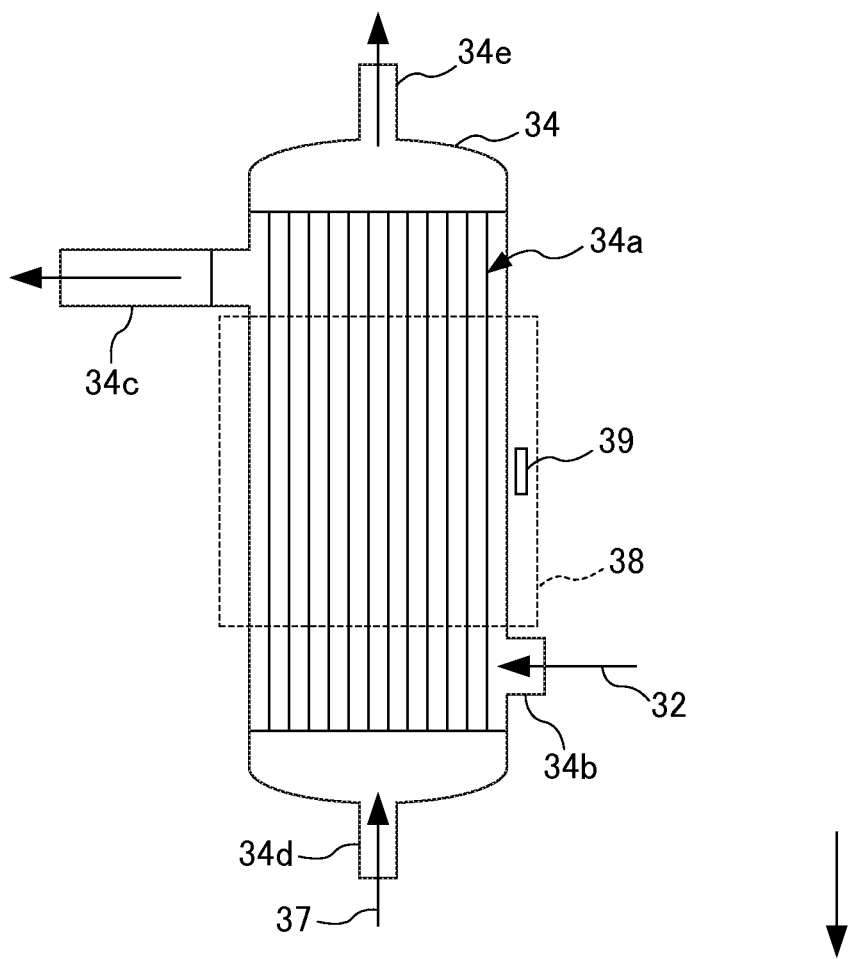
FIG. 2 is a schematic diagram illustrating the internal structure of a vaporizing humidifier.

FIG. 2 is a schematic diagram illustrating the internal structure of the humidifier 34. First, the humidifier 34 encloses a hollow fiber film 34a that serves as a gas-permeable filter. The humidifier 34 injects the liquid 37 into the hollow fiber film 34a, and passes the CDA 32 through the periphery thereof to thereby generate humidified gas. Also, as a method for varying the humidifying performance, the humidifier 34 includes a heater 38 that changes the temperature of the humidifier 34 itself. The heater 38 of the present embodiment is a belt heater, a kapton heater, or the like that can be directly attached to the shell of the humidifier 34, whereby the shell of the humidifier 34 can be uniformly heated. When the shell of the humidifier 34 is a material having poor thermal conductivity such as a fluorine resin, it is desirable that an object having excellent thermal conductivity (e.g., metal film, or the like) be wound between the shell of the humidifier 34 and the heater 38 to thereby install the heater 38. Also, it is desirable that the object temperature detecting section 39 be arranged near the heater 38 so that the vaporization amount of the humidifier 34 can be represented.

Also, the humidifier 34 includes four pipes that cause the CDA 32 or the liquid 37 to flow into the inside of the humidifier 34. Specifically, a pipe that supplies the CDA 32 is a horizontal lower pipe 34b, and a pipe that discharges the CDA 32 is a horizontal upper pipe 34c. The horizontal lower pipe 34b and the horizontal upper pipe 34c form a second flow passage that is the flow passage of the CDA 32. On the other hand, a pipe that supplies the liquid 37 is a lower pipe 34d, and a pipe that discharges the CDA 32 is an upper pipe 34e. The lower pipe 34d and the upper pipe 34e form a first flow passage that is the flow passage of the liquid 37. In this case, the direction of gravitational acceleration is the direction of the arrow shown in FIG. 2. In this manner, it is preferred that the supply direction of the liquid 37 matches the supply direction of the CDA 32 from the bottom to the top shown in FIG. 2 from the viewpoint of the vaporization performance of the humidifier 34. Note that the liquid 37 may be discharged from the humidifier 34 as in the present embodiment, or may only be supplied into the humidifier 34.

Here, the liquid 37 is preferably pure water of low impurity content or ultrapure water from the viewpoint of the cleanliness of the humidifier 34. Alternatively, when the liquid 37 is a liquid that does not contaminate the CDA 32, e.g., typical water, a liquid contamination prevention device such as a filter, an ion exchange resin, or the like may be arranged to supply pure water after purification. In connection with this, the supply pipe of the liquid 37 and the supply pipe of the CDA 32 are preferably to be made of, for example, a fluorine resin from the viewpoint of the degree of contamination of a medium. The fluorine resin has an advantage in that the inside of the pipe is viewable for ascertaining the state thereof since the material has visual transparency.

The gas mixer 40 is a mixing device that mixes the humidified gas generated by the vaporizing humidifier 34 with the CDA that has passed through the fluid control device 33b to thereby generate the humidified air 41. Here, the total flow rate of the humidified air 41 is always adjusted to a predetermined flow rate. Note that the gas mixer 40 is acceptable as long as it has a volume sufficient to mix the gases, or as long as it has a volume of a degree that allows a "filtering function" such as a filter. The latter one is preferred since the particles suspended in gas can also be removed.

The heat exchanger 42 is a device that is disposed inside of a circulation air path in the chamber 10, and performs heat exchange between circulation air and the humidified air 41 to thereby keep the temperature of both streams of air close to each other. It is preferable that the heat exchanger 42 is a fluorine resin-made pipe such as a polytetrafluoroethylene tube formed into a corrugated shape or a convoluted shape. Here, since the flow rate of the humidified air 41 flowing into the tube is a low flow rate from one per thousands to one per tens of thousands compared to that of circulation air, a disturbance in the circulation air has an only minimal effect. Note that the heat exchanger 42 is not limited to performing heat exchange between the humidified air 41 and circulation air, but may perform heat exchange between the humidified air 41 and the liquid of which the temperature is controlled so as to be substantially the same as that of circulation air, e.g., pure water.

By using the plurality of air nozzles 43, the humidified air 41 that has passed through the heat exchanger 42 is locally ejected onto the main parts of the optical elements of the components provided in the chamber 10, i.e., the final optical member 2a that constitutes the illumination optical system 2, and the projection lenses 5a and 5b that respectively constitute the top surface and the bottom surface of the projection optical system 5. On the other hand, a part of the humidified air 41 passed through the heat exchanger 42 is introduced into a humidity measuring BOX 44 that is disposed at a pipe separately from the supply pipe for the air nozzles 43. Here, a separated pipe is opened to the air conditioning machine room 11 to make the atmospheric pressure in the pipe and the atmospheric pressure in the booth 13 substantially the same. Also, a humidity detecting section (humidity measurement unit) 45 that measures the humidity of the humidified air 41 is disposed inside the humidity measuring BOX 44. Methods for detecting a humidity level acceptable to the humidity detecting section (sensor) 45 include a method for utilizing the extensibility of an object (hair or nylon) using moisture adsorption, a mirror surface cooling type based on the thermodynamic principle, a high molecular resistance type based on a change in the electrical characteristics using moisture adsorption, a high molecular capacitance type, an aluminum oxide capacitance type, or the like. In the present embodiment, the humidity detecting section 45 employs a small and inexpensive high molecular capacitance type detection method that performs humidity control mainly by detecting the relative humidity.

Here, the relative humidity is the pressure of steam contained in the atmosphere at a certain temperature (steam partial pressure) divided by the saturated steam pressure at the temperature. Thus, the relative humidity changes when the temperature of gas that contains the same quantity of steam changes. Furthermore, the aforementioned definition is valid under the condition of 1 atmospheric pressure (101.3 kPa). Hence, when the atmospheric pressure changes, the relative humidity also changes based on the following formula.

Relative humidity=(steam partial pressure/saturated steam pressure)×(atmospheric pressure/101.3 kPa)

For this reason, when the relative humidity is measured, the location where the humidity detecting section 45 is placed is important. In the present embodiment, the humidity detecting section 45 is arranged within the humidity measuring BOX 44 provided at a separately-provided pipe. Consequently, the temperature and the pressure of the humidified air 41 are substantially the same as those of the atmosphere in the booth 13, whereby the amount of error measured by the humidity detecting section 45 is significantly suppressed.

In addition, the component material of a humidity sensor employed for the humidity detecting section 45 may release the chemicals in minute quantities, which may render the surfaces of various optical members cloudy. Also, in this case, by providing the humidity detecting section 45 within the humidity measuring BOX 44 provided at a separately-provided pipe, the chemicals contained in the humidified air 41, which is supplied into the main parts of the optical elements, can be significantly suppressed. When the humidity detecting section 45 is composed of a material low in contaminants, the humidified air 41 needs not be separated as in the present embodiment. Even when the humidity detecting section 45 contains a material which may possibly to be contaminated, an ion adsorption film for removing the contaminant is disposed downstream of the humidity detecting section 45, whereby the humidified air 41 may not be separated. However, when the location where the humidity detecting section 45 is disposed is a space different from that in atmosphere in the booth 13 as a result of not performing the separation of the humidified air 41, the amount of error needs to be taken into consideration.

The control calculation section 46a is a control computing device that controls the fluid control devices 33a and 33b based on the output (humidity data) obtained by the humidity detecting section 45 to thereby control the humidity of the humidified air 41. More specifically, the control calculation section 46a derives an operation amount from an error amount using PID calculation or the like with respect to the value measured by a humidity sensor 47 that measures humidity in the booth 13, and controls the humidity of the humidified air 41 based on the operation amount. Hereinafter, the value to be measured by a humidity sensor 47 that measures humidity in the booth 13 is set as the "target humidity 50".

Figure 3:
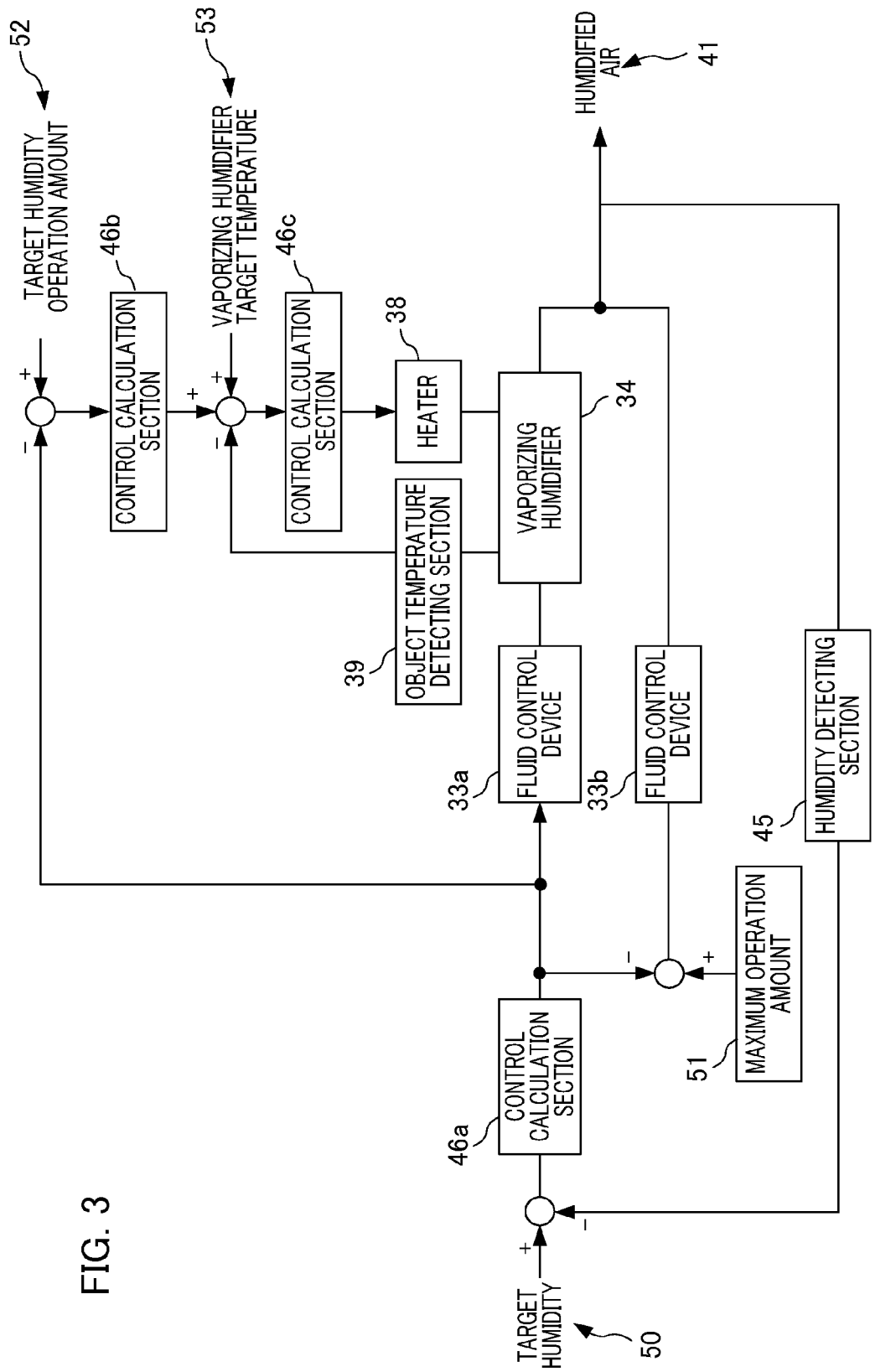
FIG. 3 is a block diagram illustrating humidity control according to a first embodiment of the present invention.

Next, the operation of the humidified air supply device 30 will now be described. FIG. 3 is a block diagram illustrating humidity control of the humidified air 41 in the humidified air supply device 30 of the present embodiment. First, the control calculation section 46a compares the humidity information about the humidified air 41 detected by the humidity detecting section 45 with the target humidity 50 in order to control the humidity of the humidified air 41 so as to be the target humidity 50. Based on a first error amount obtained by the comparison, the control calculation section 46a calculates the operation amount for adjusting the flow rate ratio of the CDA 32 that passes through the fluid control device 33a to the CDA 32 that passes through the fluid control device 33b so as to make the first error amount approach zero. At this time, an adder (not shown) calculates the operation amount, which is provided as an instruction to the fluid control device 33b, based on the maximum operation amount 51 and the amount of operation of the fluid control device 33a. Note that the maximum operation amount 51 is changed appropriately based on the total flow rate of the CDA 32.

Next, the control calculation section 46b converts a second error amount, in which the amount of operation of the fluid control device 33a and a target humidity operation amount 52 are in comparison, into a temperature. Next, the control calculation section 46c calculates the amount of operation of the heater 38 based on a third error amount that results from comparing the temperature, the temperature of the humidifier 34 detected by the object temperature detecting section 39, and a humidifier target temperature 53. Then, by operating the heater 38 based on the calculated operation amount, the surface temperature of the humidifier 34 is preferably adjusted. Consequently, the temperature of the liquid 37 and the CDA 32 that pass through the inside of the humidifier 34 changes, resulting in a change in a saturated steam pressure. Here, when the flow rate of the CDA 32 that passes through the inside of the humidifier 34 increases due to an insufficient humidifying performance of the humidifier 34, the control calculation section 46b adjusts the surface temperature of the humidifier 34 so as to rise. When the surface temperature of the humidifier 34 rises, a saturated steam pressure increases, and the humidifying performance of the humidifier 34 increases, whereby the flow rate of the CDA 32 that passes through the humidifier 34 can be reduced.

As described above, according to the exposure apparatus of the present invention, the humidifying performance of the humidifier 34 provided in the humidified air supply device 30 is varied appropriately, whereby an insufficient humidifying performance can be suppressed. Also, when the humidifier 34 falls into a situation where the humidifying performance is excessive, the generation of dew condensation within the pipe after passing through the humidifier 34 can be prevented, whereby a stable humidity control can be achieved. Furthermore, the humidified air supply device 30 supplies the humidified air 41 having a humidity that is substantially the same as that of air on the periphery of the optical elements constituting the exposure apparatus 1, whereby the fluctuation of laser interferometers 8 and 9 that are utilized for the positioning of the stages 4 and 7 is suppressed, resulting in stable measurements. With this arrangement, the alignment accuracy of the exposure apparatus 1 is also improved.

(Second Embodiment)

Figure 4:
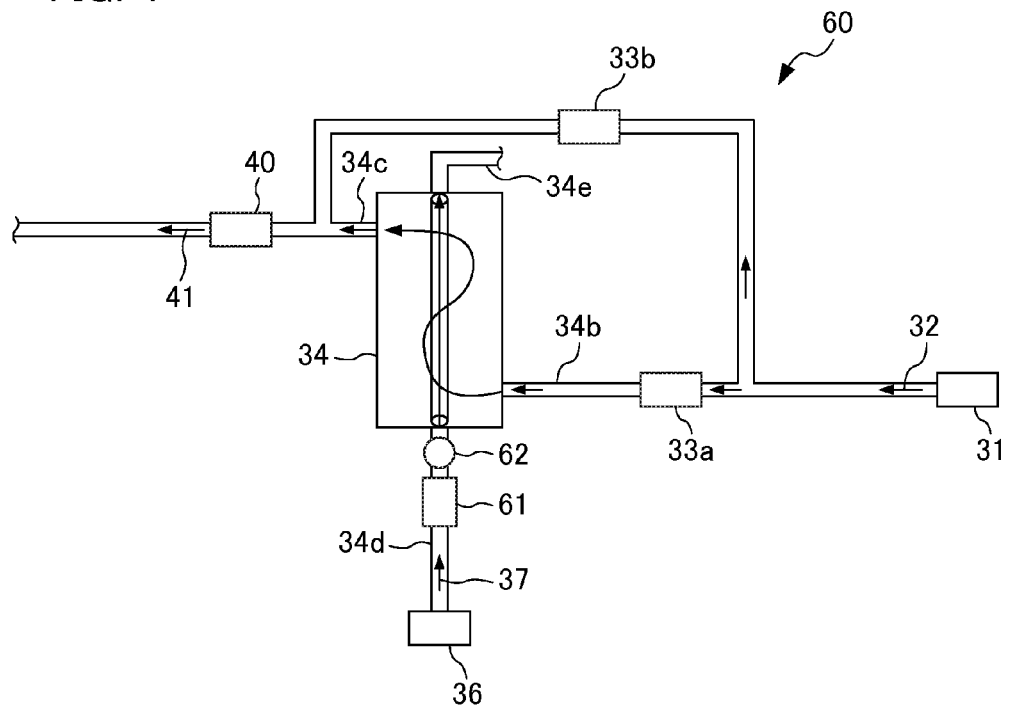
FIG. 4 is a schematic diagram illustrating the configuration of a humidified air supply device according to a second embodiment of the present invention.

Next, a description will be given of the humidified air supply device of the exposure apparatus according to a second embodiment of the present invention. FIG. 4 is a schematic diagram illustrating the configuration of a humidified air supply device 60 provided in the exposure apparatus according to the second embodiment. In FIG. 4, the same components as those shown in FIG. 1 are given the same reference numerals, and explanation thereof will be omitted. A feature of the present embodiment is that the target subjected to supplementary humidification control is changed from the surface temperature of the humidifier 34 to the temperature of the liquid 37. Specifically, in the first embodiment, the surface temperature of the humidifier 34 is detected by the object temperature detecting section 39 and is adjusted using the heater 38, whereas, in the present embodiment, the temperature of the liquid 37 to be supplied to the humidifier 34 is controlled to thereby adjust the humidifying performance of the humidifier 34. In this case, the humidified air supply device 60 includes a heater (heater for liquid) 61 and a liquid temperature detecting section 62 both of which are provided at the lower pipe 34d having a connection opening for a medium instead of the heater 38 and the object temperature detecting section 39 of the first embodiment. It is desirable that the supply pressure (or flow rate) of the liquid 37 be constant to stabilize the performance of the humidifier 34. When the supply of the liquid 37 is not stable, a pressure control device such as a regulator, a flow rate control device, or the like is disposed at the lower pipe 34*d* having a connection opening for a medium to thereby stabilize the supply performance. The control of the humidified air supply device 60 is made by arranging the configuration such that, in the block diagram of FIG. 3 described in the first embodiment, the heater 38 and the object temperature detecting section 39 are respectively changed to the heater 61 and the liquid temperature detecting section 62 and the humidifier target temperature 53 is changed to the target temperature of the liquid 37. With this arrangement, the same operation and effect as in the first embodiment can be achieved.

(Third Embodiment)

Figure 5:
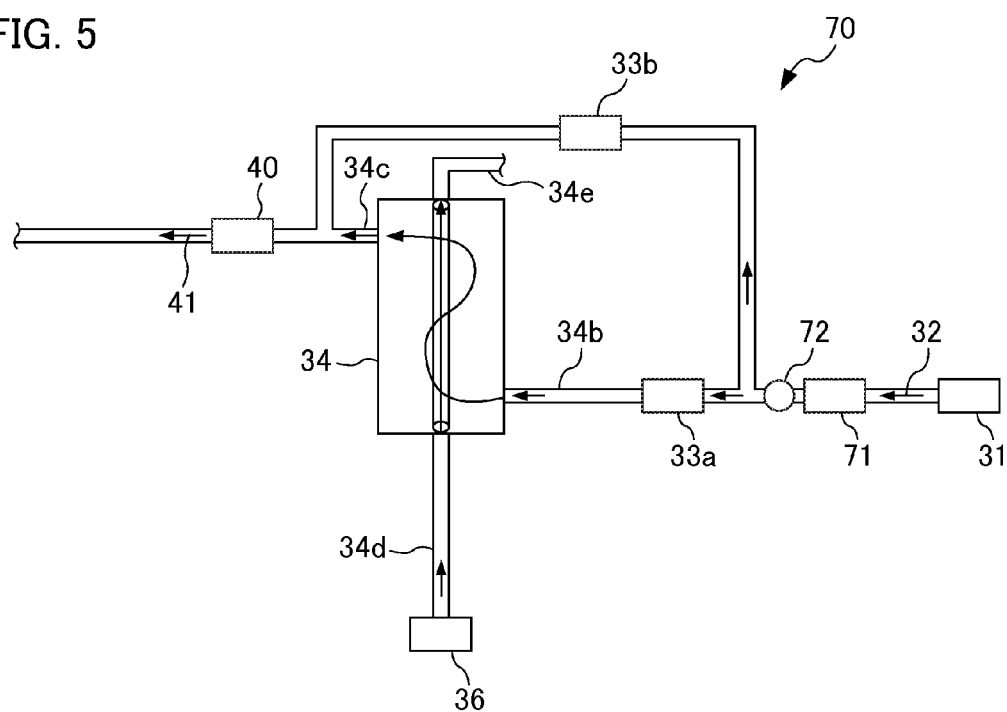
FIG. 5 is a schematic diagram illustrating the configuration of a humidified air supply device according to a third embodiment of the present invention.

Next, a description will be given of the humidified air supply device of the exposure apparatus according to a third embodiment of the present invention. FIG. 5 is a schematic diagram illustrating the configuration of a humidified air supply device 70 provided in the exposure apparatus according to the third embodiment. In FIG. 5, the same components as those shown in FIG. 1 are given the same reference numerals, and explanation thereof will be omitted. A feature of the present embodiment is that the target subjected to supplementary humidification control is the CDA 32 and the temperature of the CDA 32 to be supplied to the humidifier 34 is controlled to thereby adjust the humidifying performance of the humidifier 34. In this case, the humidified air supply device 70 includes a heater (heater for gas) 71 and a gas temperature detecting section 72, both of which are provided at the supply pipe from the CDA supply source 31 instead of the heater 38 and the object temperature detecting section 39 of the first embodiment. Although the heater 71 and the gas temperature detecting section 72 are disposed at an upstream side of the fluid control device 33*a* in FIG. 5, the heater 71 and the gas temperature detecting section 72 may be disposed at a downstream side of the fluid control device 33*a*. When the arrangement shown in FIG. 5 is used, it is desirable that the pressure of the CDA supply source 31 be stabilized to enable the gas temperature detecting section 72 to detect temperature accurately. When the pressure of the CDA supply source 31 is not stabilized, a pressure control device is disposed at an upstream side of the gas temperature detecting section 72 to stabilize the pressure. The control of the humidified air supply device 70 is made by arranging the configuration such that, in the block diagram of FIG. 3 described in the first embodiment, the heater 38 and the object temperature detecting section 39 are respectively changed to the heater 71 and the gas temperature detecting section 72 and the humidifier target temperature 53 is changed to the target temperature of the CDA 32. With this arrangement, the same operation and effect as in the first embodiment can be achieved.

(Fourth Embodiment)

Figure 6:
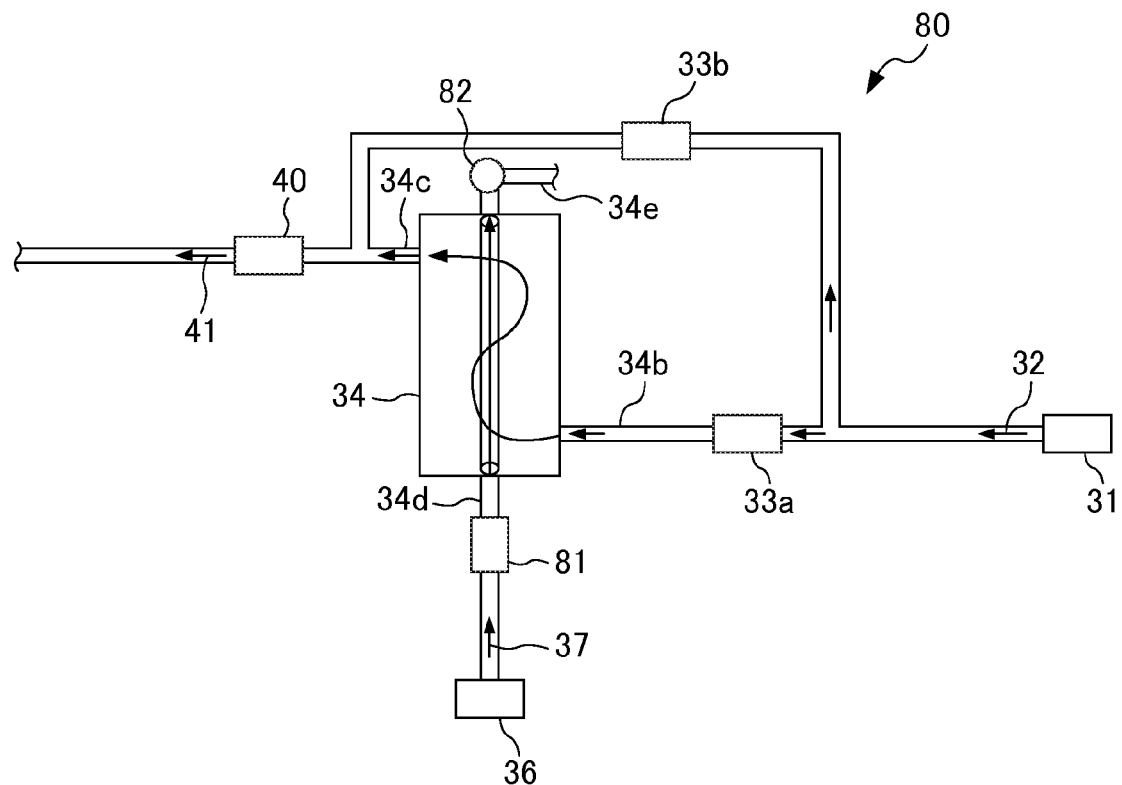
FIG. 6 is a schematic diagram illustrating the configuration of a humidified air supply device according to a fourth embodiment of the present invention.

Next, a description will be given of the humidified air supply device of the exposure apparatus according to a fourth embodiment of the present invention. FIG. 6 is a schematic diagram illustrating the configuration of a humidified air supply device 80 provided in the exposure apparatus according to the fourth embodiment. In FIG. 6, the same components as those shown in FIG. 1 are given the same reference numerals, and explanation thereof will be omitted. A feature of the present embodiment is that the target subjected to supplementary humidification control is the flow rate of the liquid 37 and the flow rate of the liquid 37 to be supplied to the humidifier 34 is controlled to thereby adjust the humidifying performance of the humidifier 34. In this case, the humidified air supply device 80 includes a liquid flow rate variable instrument 81 provided at the lower pipe 34*d* having a connection opening for a medium and a liquid flow rate detecting section 82 provided at an upper pipe 34*e* having a connection opening for a medium instead of the heater 38 and the object temperature detecting section 39 of the first embodiment. Although the liquid flow rate detecting section 82 is disposed at a downstream side of the humidifier 34 in FIG. 6, this is effective when the liquid 37 passing through the humidifier 34 is in connection with a drainage line (not shown). On the other hand, when a drainage line is not configured, the liquid flow rate detecting section 82 may be disposed at an upstream side of the humidifier 34. In this case, it is desirable that the liquid flow rate detecting section 82 be disposed at a downstream side of the liquid flow rate variable instrument 81. The control of the humidified air supply device 80 is made by arranging the configuration such that, in the block diagram of FIG. 3 described in the first embodiment, the heater 38 and the object temperature detecting section 39 are respectively changed to the liquid flow rate variable instrument 81 and the liquid flow rate detecting section 82 and the humidifier target temperature 53 is changed to the target flow rate of the liquid 37. With this arrangement, the same operation and effect as in the first embodiment can be achieved.

(Fifth Embodiment)

Figure 7:
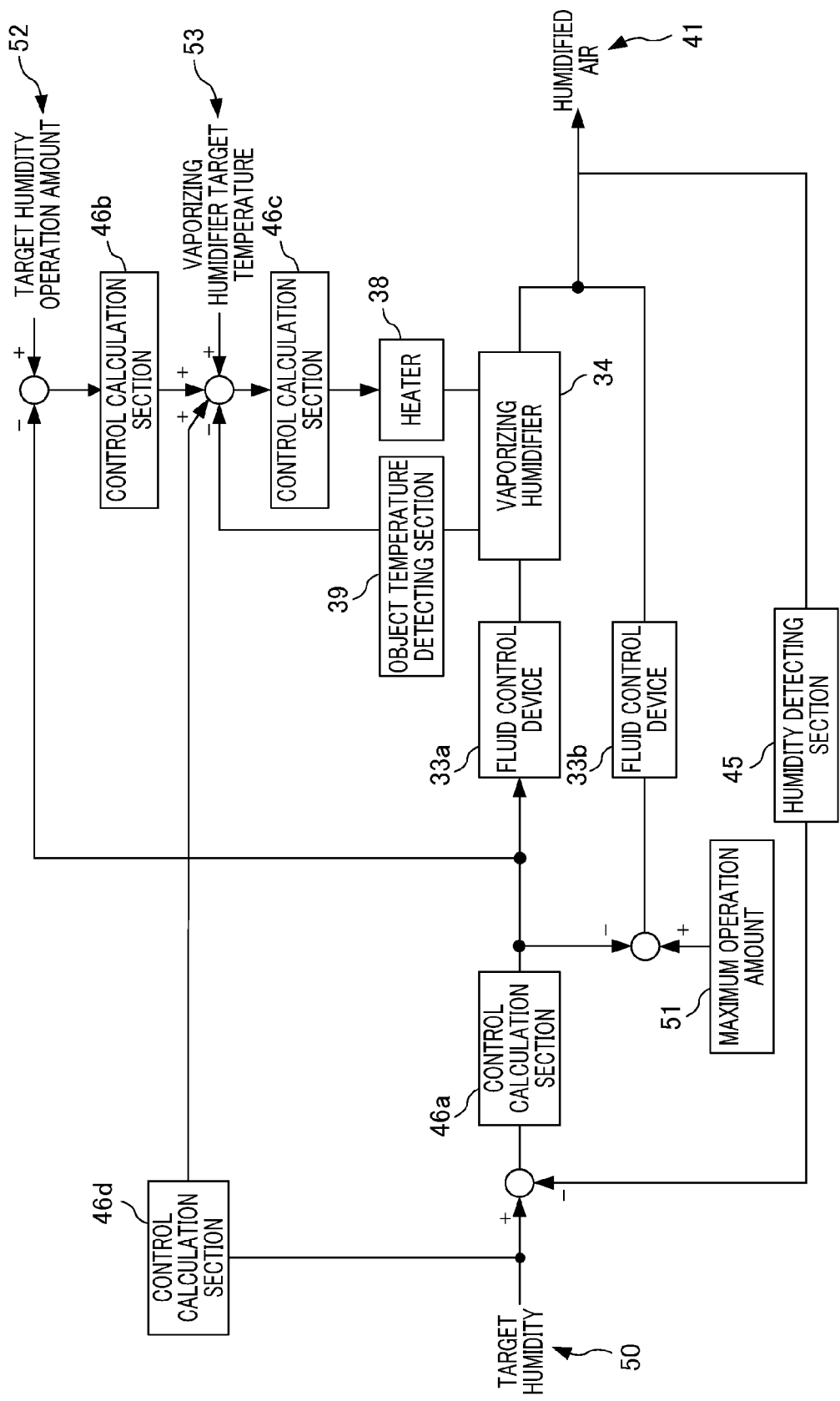
FIG. 7 is a block diagram illustrating humidity control according to a fifth embodiment of the present invention.

Next, a description will be given of the humidified air supply device of the exposure apparatus according to a fifth embodiment of the present invention. FIG. 7 is a block diagram illustrating the humidity control of the humidified air 41 to be executed by the humidified air supply device of the present invention. In FIG. 7, the same components as those shown in FIG. 3 are given the same reference numerals, and explanation thereof will be omitted. A feature of the present embodiment is that, while in the embodiments described above, the humidity control of the humidified air 41 is executed using feedback control, feedforward control is further added. Specifically, in the present embodiment, the control calculation section 46*d* converts the target humidity 50 of the humidified air 41 into a temperature quantity, and then adds it to the control calculation section 46*b*. Such feedforward control can be applied simultaneously in the first to fourth embodiments. With this arrangement, the effects of the humidified air supply devices according to the embodiments described above can be made more accurately.

Note that it is desirable that the humidified air supply device according to the first to fourth embodiments be configured independently. In all of the humidified air supply devices according to the first to fourth embodiments, the amount of operation of the CDA 32 to be supplied to the humidifier 34 is controlled by feedback. Hence, when the embodiments are used in combination, the control defect may be caused due to control interference. As a countermeasure for this, for example, a humidified air supply device performs the temperature control of the liquid 37, i.e., coarse control that has a greater impact on the humidity performance immediately after the start of control. After coarse control is executed, the humidified air supply device may be switched to perform precise temperature regulation that controls the shell temperature of the humidifier 34 so as to control the humidity of the CDA 32 until the target humidity 50 is reached.

(Sixth Embodiment)

Figure 8:
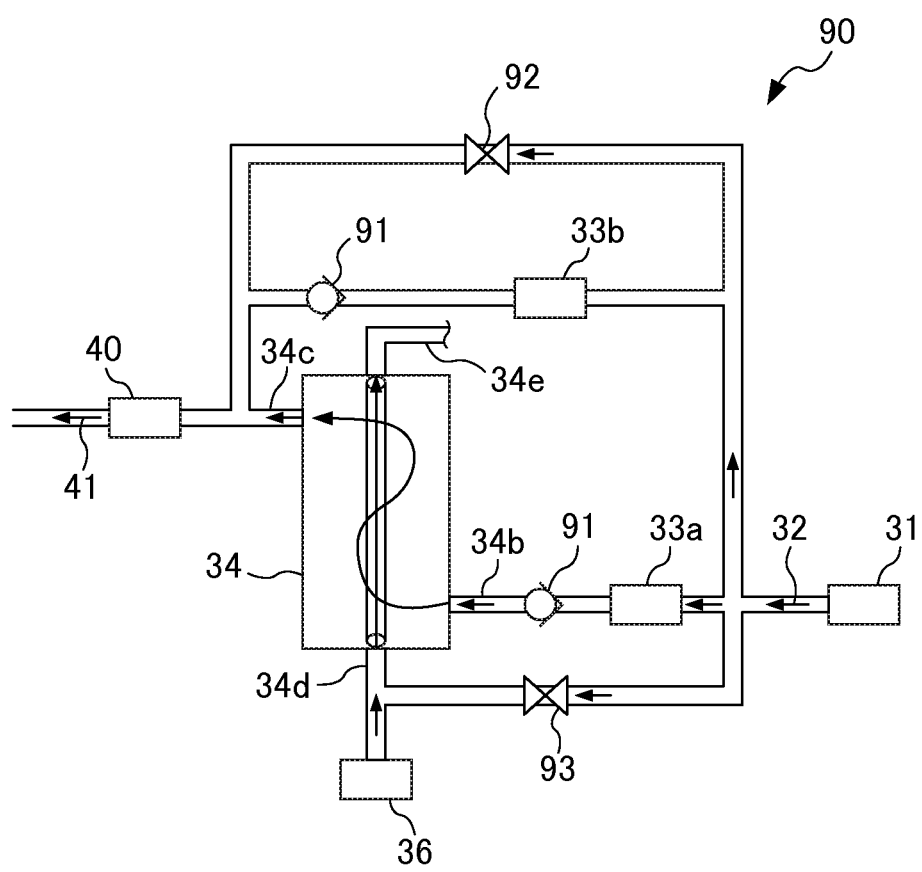
FIG. 8 is a schematic diagram illustrating the configuration of a humidified air supply device according to a sixth embodiment of the present invention.

Next, a description will be given of the humidified air supply device of the exposure apparatus according to a sixth embodiment of the present invention. FIG. 8 is a schematic diagram illustrating the configuration of a humidified air supply device 90 provided in the exposure apparatus according to a sixth embodiment. In FIG. 8, the same components as those shown in FIG. 1 are given the same reference numerals, and explanation thereof will be omitted. A feature of the present embodiment is that equipment for preventing the humidified air supply device from being damaged when the device is stopped is provided. Since the humidifier 34 mixes the CDA 32 and the liquid 37 in the interior for humidification, the liquid 37 may flow back into the pipe for the CDA 32 when a malfunction or a misoperation occurs. In this case, when the liquid 37 enters the pipe for the CDA 32, much of the gas pipe equipment is damaged. Thus, in the present embodiment, a non-return valve 91 is provided at the downstream pipe of each of the fluid control devices 33a and 33b, whereby the entry of the liquid 37 into the supply pipe for the CDA 32 is prevented. As long as the backflow of the liquid 37 can be prevented, the present invention is not limited to the non-return valve 91, but it is possible to be formed of a plurality of components such as a combination of an on/off valve and a pressure meter (flow rate meter) or the like.

Also, when the liquid 37 remains inside the humidifier 34 in the state where the humidified air supply device has stopped supplying the CDA 32 and the liquid 37 to the humidifier 34, the liquid 37 is continuously vaporized from the interior of the humidifier 34. In this case, inside of the pipe for the liquid 37 near the humidifier 34 is saturated, resulting in dew condensation. Consequently, the liquid 37 accumulates inside the pipe, whereby the liquid 37 may be ejected to a usage side upon activation of the device. Accordingly, in the present embodiment, a purge valve 92, which opens when the device is in a stopped-state, is provided at a path (branch path) that is a different location from the fluid control devices 33a and 33b in the pipe for the CDA. Hence, the liquid 37 in the humidifier 34 is discharged irrespective of the open/closed state of the fluid control devices 33a and 33b. Note that the purge valve 92 may be arranged at the same path as that of each of the fluid control devices 33a and 33b. In this case, the fluid control devices 33a and 33b are in the open state when the purge valve 92 is used. Also, as long as the liquid 37 in the humidifier 34 is discharged, the CDA supply source 31 may not always be connected with the purge valve 92. For example, a pure nitrogen gas supply source (not shown) may be connected with the purge valve 92.

Furthermore, in order to suppress vaporization upon stoppage of the device described above, a path for supplying the CDA 32 may be provided between the humidifier 34 and the liquid supply source 36, and a drain valve 93 may be disposed on the path to thereby discharge the liquid 37 in the humidifier 34. When a liquid discharge port for the humidifier 34 is present, the drain valve 93 may be arranged at the discharge port. Also, a gas supply path may not be connected with the CDA supply source 31, but may be connected with a nitrogen gas supply source described above.

(Device Manufacturing Method)

Next, a method of manufacturing a device (semiconductor device, liquid crystal display device, etc.) as an embodiment of the present invention is described. The semiconductor device is manufactured by a front-end process in which an integrated circuit is formed on a wafer, and a back-end process in which an integrated circuit chip is completed as a product from the integrated circuit on the wafer formed in the front-end process. The front-end process includes a step of exposing a wafer coated with a photoresist to light using the above-described exposure apparatus of the present invention, and a step of developing the exposed wafer. The back-end process includes an assembly step (dicing and bonding), and a packaging step (sealing). The liquid crystal display device is manufactured by a process in which a transparent electrodes are formed. The process of forming a plurality of transparent electrodes includes a step of coating a glass substrate with a transparent conductive film deposited thereon with a photoresist, a step of exposing the glass substrate coated with the photoresist to light using the above-described exposure apparatus, and a step of developing the exposed glass substrate. The device manufacturing method of this embodiment has an advantage, as compared with a conventional device manufacturing method, in at least one of performance, quality, productivity and production cost of a device.

(Other Embodiments)

In the aforementioned embodiments, when the calculation of the target humidity 50 is executed using the humidity detecting section 45, the control calculation section 46 may convert the target humidity 50 based on the dew-point temperature of the humidified air 41. In this case, it is desirable that the dew-point temperature be set lower than the temperature of air in the chamber 10.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-99996 filed Apr. 23, 2010 which are hereby incorporated by reference herein it their entirety.

What is claimed is:

1. An exposure apparatus comprising:
an optical element, and
a supply unit that supplies humidified gas to near a surface of the optical element,
wherein the supply unit comprises:
a humidifier;
a first regulator that regulates a flow rate of first gas which is humidified by passing through the humidifier;
a second regulator that regulates a flow rate of second gas which does not pass through the humidifier;
a variable instrument that varies performance of the humidifier;
a sensor that detects a humidity of the humidified gas supplied near the surface of the optical element; and
a controller that operates the first and second regulators to adjust a flow rate ratio of the first gas and the second gas based on the humidity of the humidified gas detected by the sensor and a pre-set target humidity, and operates the variable instrument to keep the flow rate of the first gas constant based on a difference between an amount of operation of the first regulator and an amount of pre-set target operation.

2. The exposure apparatus according to claim 1, wherein the controller controls humidity of the humidified gas using feedback control.

3. The exposure apparatus according to claim 2, wherein the controller controls humidity of the humidified gas using feedforward control in addition to the feedback control.

4. The exposure apparatus according to claim 1, wherein the variable instrument comprises a heater disposed outside a shell of the humidifier and an object temperature detecting section that detects the surface temperature of the shell of the humidifier, and varies the performance of the humidifier by changing the surface temperature of the humidifier.

5. The exposure apparatus according to claim 1, wherein the variable instrument comprises a heater disposed on a supply pipe carrying liquid that serves as a medium for the humidifier and a liquid temperature detecting section that detects the temperature of the liquid, and varies the performance of the humidifier by changing the temperature of the liquid.

6. The exposure apparatus according to claim 1, wherein the variable instrument comprises a heater disposed on a supply pipe from which the gas is supplied and a gas temperature detecting section that detects the temperature of the gas, and varies the performance of the humidifier by changing the temperature of the gas.

7. The exposure apparatus according to claim 1, wherein the variable instrument comprises a liquid flow rate variable instrument disposed on a supply pipe for liquid that serves as a medium for the humidifier and a liquid flow rate detecting section that detects the flow rate of the liquid, and varies the performance of the humidifier by changing the flow rate of the liquid.

8. The exposure apparatus according to claim 1, wherein the supply unit includes a non-return valve, which prevents the entry of liquid into a gas supply pipe, provided at a downstream side pipe from the first and the second regulators.

9. The exposure apparatus according to claim 1, wherein the supply unit includes a purge valve, which discharges any liquid remaining in the humidifier regardless of an open/closed state of the first and second regulators, provided at a branch path that is a different location from the first and second regulators in a gas supply pipe.

10. The exposure apparatus according to claim 1, wherein the supply unit includes a path that supplies the gas to a liquid supply pipe of the humidifier, and a drain valve on the path.

11. The exposure apparatus according to claim 1, wherein a dew-point temperature of the humidified air is set lower than an internal temperature of a chamber that encloses a space in contact with the optical element.

12. The exposure apparatus according to claim 1, wherein the humidity of the humidified gas is adjusted to a humidity surrounding the optical element.

13. The exposure apparatus according to claim 1, wherein, in a case where the flow rate of the first gas increases due to a low performance of the humidifier, the controller operates the first regulator to reduce the flow rate of the first gas by operating the variable instrument to improve the performance of the humidifier to keep the flow rate of the first gas constant.

14. The exposure apparatus according to claim 1, wherein the humidifier comprises:
a pipe that forms a flow passage of liquid for humidifying the first gas that passes through the humidifier; and
a heater that changes a temperature of the humidifier to change a temperature of the liquid.

15. The exposure apparatus according to claim 1, wherein:
the first regulator regulates the flow rate of the first gas in a dried gas, which is introduced from a clean room facility where the exposure apparatus is installed,
the second regulator regulates the flow rate of the second gas in the dried gas,
the supply unit mixes the first gas that is humidified by passing through the humidifier with the second gas that does not pass through the humidifier, and generates the humidified gas that is supplied near the surface of the optical element.

16. A device manufacturing method comprising the steps of:
exposing a substrate using an exposure apparatus; and
developing the substrate,
wherein the exposure apparatus comprises:
an optical element, and
a supply unit that supplies humidified gas near a surface of the optical element,
wherein the supply unit comprises:
a humidifier;
a first regulator that regulates a flow rate of first gas which is humidified by passing through the humidifier;
a second regulator that regulates a flow rate of second gas, which does not pass through the humidifier;
a variable instrument that varies a performance of the humidifier;
a sensor that detects a humidity of the humidified gas supplied near the surface of the optical element; and
a controller that operates the first and second regulators to adjust a flow rate ratio of the first gas and the second gas based on the humidity of the humidified gas detected by the sensor and a pre-set target humidity, and operates the variable instrument to keep the flow rate of the first gas constant based on a difference between an amount of operation of the first regulator and an amount of pre-set target operation.

17. A supply apparatus that supplies humidified gas, the supply apparatus comprising:
a humidifier;
a first regulator that regulates a flow rate of first gas, which is humidified by passing through the humidifier;
a second regulator that regulates a flow rate of second gas, which does not pass through the humidifier;
a variable instrument that varies a performance of the humidifier;
a sensor that detects a humidity of the humidified gas supplied near the surface of the optical element; and
a controller that operates the first and second regulators to adjust a flow rate ratio of the first gas and the second gas based on the humidity of the humidified gas detected by the sensor and pre-set target humidity, and operates the variable instrument to keep the flow rate of the first gas constant based on a difference between an amount of operation of the first regulator and an amount of pre-set target operation.

18. The supply apparatus according to claim 17, wherein the humidified gas is supplied near a surface of an optical element, which is usable in an exposure apparatus installed in a clean room facility.

19. A method of supplying humidified gas, the method comprising the steps of:
detecting a humidity of the humidified gas with a sensor;
adjusting a flow rate ratio of first gas, which is humidified by passing through a humidifier, and second gas, which does not pass through the humidifier, with first and second regulators based on the humidity of the humidified gas detected by the sensor and a target humidity of the humidified gas; and
operating a variable instrument that varies a performance of the humidifier to keep the flow rate of the first gas constant based on a difference between an amount of operation of the first regulator and an amount of pre-set target operation.

20. The method according to claim 19, wherein the humidified gas is supplied near a surface of an optical element, which is usable in an exposure apparatus installed in a clean room facility.

* * * * *